(12) United States Patent
Sirringhaus et al.

(10) Patent No.: US 7,571,529 B2
(45) Date of Patent: Aug. 11, 2009

(54) METHOD FOR FORMING AN ELECTRONIC DEVICE IN MULTI-LAYER STRUCTURE

(75) Inventors: Henning Sirringhaus, Cambridge (GB); Richard Henry Friend, Cambridge (GB); Natalie Stutzmann, Eindhoven (NL); Paul Smith, Zürich (CH)

(73) Assignees: Cambridge University Technical Services Limited, Cambridge (GB); Eidgenossische Technische Hochschule Zurich, Zurich (CH)

( * ) Notice: Subject to any disclaimer, the term of this patent is extended or adjusted under 35 U.S.C. 154(b) by 170 days.

(21) Appl. No.: 10/398,442

(22) PCT Filed: Oct. 4, 2001

(86) PCT No.: PCT/GB01/04421

§ 371 (c)(1),
(2), (4) Date: Dec. 15, 2003

(87) PCT Pub. No.: WO02/29912

PCT Pub. Date: Apr. 11, 2002

(65) Prior Publication Data

US 2005/0071969 A1    Apr. 7, 2005

(30) Foreign Application Priority Data

Oct. 4, 2000    (GB) ................................ 0024294.1

(51) Int. Cl.
*B23P 17/00*    (2006.01)
(52) U.S. Cl. ............................. 29/417; 29/825; 29/830; 29/831; 29/832

(58) Field of Classification Search .................... 29/847, 29/835, 846, 830, 831, 417, DIG. 15; 83/30, 83/41, 36, 54, 56; 428/216; 250/306; 174/262; 439/43; 438/232, 149
See application file for complete search history.

(56) References Cited

U.S. PATENT DOCUMENTS

| 3,501,831 | A | * | 3/1970 | Gordon | ................. | 29/853 |
| 3,555,964 | A | * | 1/1971 | Fleming | ................. | 408/11 |
| 4,425,777 | A | * | 1/1984 | Jeglinski | ................. | 72/325 |
| 4,736,521 | A | * | 4/1988 | Dohya | ................. | 29/830 |
| 4,835,859 | A | * | 6/1989 | Beckett | ................. | 29/846 |

(Continued)

FOREIGN PATENT DOCUMENTS

JP    9175835 A    7/1997

(Continued)

OTHER PUBLICATIONS

Stolz Roman L et al.: "Trapping Light in Polymer Photodiodes With Soft Embossed Gratings", Advanced Materials, VCH Verlagsesellschaft, Weinheim, DE. vol. 12, No. 3, Feb. 3, 2000 pp. 189-195, XP000923550.

(Continued)

*Primary Examiner*—David P Bryant
*Assistant Examiner*—Tai Nguyen
(74) *Attorney, Agent, or Firm*—Sughrue Mion, PLLC

(57) ABSTRACT

A method for forming an organic or partly organic switching device, comprising: depositing layers of conducting, semi-conducting and/or insulating layers by solution processing and direct printing; defining microgrooves in the multilayer structure by solid state embossing; and forming a switching device inside the microgroove.

58 Claims, 16 Drawing Sheets

U.S. PATENT DOCUMENTS

| | | | | | |
|---|---|---|---|---|---|
| 4,968,992 | A | * | 11/1990 | Komuro | 347/64 |
| 5,069,345 | A | * | 12/1991 | Irwin | 220/270 |
| 5,546,375 | A | * | 8/1996 | Shimada et al. | 369/126 |
| 5,569,968 | A | * | 10/1996 | Lal et al. | 310/322 |
| 5,581,083 | A | * | 12/1996 | Majumdar et al. | 250/306 |
| 5,585,827 | A | * | 12/1996 | Murakami | 347/64 |
| 5,812,227 | A | * | 9/1998 | Toshida et al. | 349/88 |
| 5,976,347 | A | * | 11/1999 | Wakabayashi et al. | 205/640 |
| 5,999,236 | A | * | 12/1999 | Nakajima et al. | 349/43 |
| 6,003,419 | A | * | 12/1999 | Irita et al. | 83/171 |
| 6,046,972 | A | * | 4/2000 | Kuroda et al. | 369/126 |
| 6,176,010 | B1 | * | 1/2001 | Droz | 29/832 |
| 6,303,014 | B1 | * | 10/2001 | Taylor et al. | 205/103 |
| 6,485,884 | B2 | * | 11/2002 | Wolk et al. | 430/200 |
| 6,640,433 | B1 | * | 11/2003 | Kuroda et al. | 29/846 |

FOREIGN PATENT DOCUMENTS

| | | | |
|---|---|---|---|
| JP | 10137861 | A | 5/1998 |
| JP | 11188427 | A | 7/1999 |
| JP | 11224880 | A | 8/1999 |
| JP | 11248800 | A | 8/1999 |
| JP | 11254059 | A | 9/1999 |
| WO | WO 01/60589 | A1 | 8/2001 |

OTHER PUBLICATIONS

Wang J et al: "Direct Nanoimprint of Submicron Organic Light-Emitting Structures" Applied Physics Letters, American Institute of Physics Letters, American Institute of Physics New York, US, vol. 75 No. 18, Nov. 1, 1999, pp. 2767-2769, XP000875934.

Makela T et al: Imprinted Electrically Conductive Polyaniline on Science and Technology Conference on Science and Technology of Synthetic Metals, Gastein, Austria, Jul. 15-21, 2000, vol. 121, No. 1-3, pp. 1309-1310, XP001052671M Synthetic Metals, Mar. 15, 2001, Elsevier, Switzerland.

Chwang A B et al: "Fabrication of a Sexithiophene Semiconduction Wire: Nanoshaving With an Atomic Force Microscope.TIP" Advanced Materials, VCH Verlagsgesellschaft, Weinheim, DE, vol. 12, No. 4, Feb. 17, 2000, pp. 285-288, XP000919763.

Granlund T et al: "Pattering of Polymer Light-Emitting Diodes With Soft Lithography" Advanced Materials, VCH Verlagsgesellschaft, Weinheim, DE, vol. 12, No. 4, Feb. 17, 2000, pp. 269-273, XP000919758.

Translation of foreign Office Action dated Jun. 17, 2008.

* cited by examiner

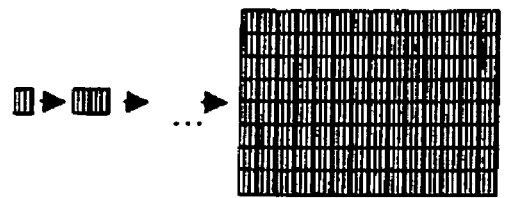
Fig. 16a
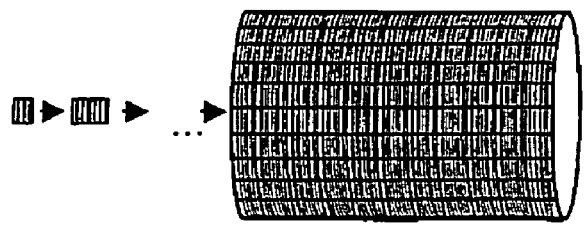
Fig. 16b
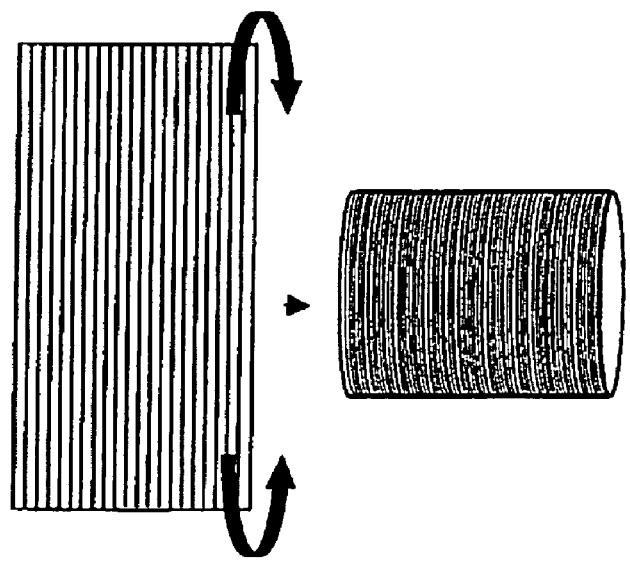
Fig. 16c
Fig. 16

METHOD FOR FORMING AN ELECTRONIC DEVICE IN MULTI-LAYER STRUCTURE

BACKGROUND OF THE INVENTION

1. Field of the Invention

This invention relates to electronic devices, especially organic electronic devices, and methods for forming such devices.

2. Description of the Related Art

Semiconducting conjugated polymer thin-film transistors (TFTs) have recently become of interest for applications in cheap, logic circuits integrated on plastic substrates (C; Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Left. 73, 142 (1998)). In test device configurations with a polymer semiconductor and inorganic metal electrodes and gate dielectric layers high-performance TFTs have been demonstrated. Charge carrier mobilities up to 0.1 cm2Ns and ON-OFF current ratios of 106-108 have been reached, which is comparable to the performance of amorphous silicon TFTs (H. Sirringhaus, et al.; Advances in Solid State Physics 39, 101 (1999)).

One of the advantages of polymer semiconductors is that they lend themselves to simple and low-cost solution processing. However, fabrication of all-polymer TFT devices and integrated circuits requires the ability to form lateral patterns of polymer conductors, semiconductors and insulators. Various patterning technologies such as photolithography (WO 99/10939 A2), screen printing (Z. Bao, et al., Chem. Mat. 9, 1299 (1997)), soft lithographic stamping (J. A. Rogers, Appl. Phys. Lett. 75, 1010 (1999)) and micromoulding (J. A. Rogers, Appl. Phys. Lett. 72, 2716 (1998)), as well as direct ink-jet printing (H. Sirringhaus, et al., UK 0009911.9) have been demonstrated.

Many direct printing techniques are unable to provide the patterning resolution that is required to define the source and drain electrodes of a TFT. In order to obtain adequate drive current and switching speed channel lengths of less than 10 μm are required. In the case of inkjet printing this resolution problem has been overcome by printing onto a prepatterned substrate containing regions of different surface free energy (H. Sirringhaus et al., UK 0009915.0).

In U.S. patent application No. 60/182,919 a method is demonstrated by which an inorganic metal film on top of a polymer support can be microcut by solid state embossing (N. Stutzmann et al., Adv. Mat. 12, 557 (2000)). A "hard" master containing an array of sharp, protruding wedges is pushed into a polymer supported metal film at elevated temperatures. For a semicrystalline polymer, such as poly(tetrafluoroethylene-co-hexafluoropropylene) (FEP), polyethylene (PE), or poly(ethylene terepthalate) (PET), the embossing temperature is above the glass transition of the polymer, but below its melting temperature. In the case of an amorphous polymer such as atactic polystyrene (PS) or poly(methylmethacrylate) (PMMA) temperatures around the glass transition are used. During the embossing the master penetrates into the metal-polymer structure and plastic flow of material occurs away from the wedge. If the indentation depth is larger than the metal film thickness a groove is generated which cuts through the metal film. In the remaining areas the integrity of the metal-polymer layer structure is preserved because embossing is performed in the solid state and plastic flow mainly occurs laterally.

SUMMARY OF THE INVENTION

According to the present invention there is provided methods and devices as set out in the accompanying claims. In particular, according to one aspect of the invention there is provided a method for forming an. electronic device in a multilayer structure comprising at least a first layer and a second layer, the method comprising forcing a microcutting protrusion of a cutting tool into the multi-layer structure so as to cause the protrusion to microcut through the first layer.

Other aspects of the invention include devices formed by that and other methods, and integrated circuits, logic circuits, display circuits and/or memory device circuits comprising one or more of such devices. Preferably the said devices are formed on a common substrate. Preferably the said devices are formed in a common layer of an organic material.

Preferred aspects of the present invention relate to methods by which solid state embossing can be used to fabricate polymer transistor devices and circuits.

BRIEF DESCRIPTION OF THE DRAWINGS

The present invention will now be described by way of example, with reference to the accompanying drawings, in which:

FIG. 16 By combining a multitude of microcutting tools comprising the same or different relief structures large-area microcutting tools of e.g. planar (FIG. 16a) but also cylinder-shape (FIG. 16b) can readily be fabricated. Alternatively, cylinder-shaped microcutting tools can also fabricated by bending e.g. a sheet comprising protruding edges that are flexible enough (16c).

DETAILED DESCRIPTION OF THE ILLUSTRATIVE NON-LIMITING EMBODIMENTS OF THE INVENTION

A first example demonstrates the application of solid state embossing to microcutting of conducting polymer films.

Figure 1:
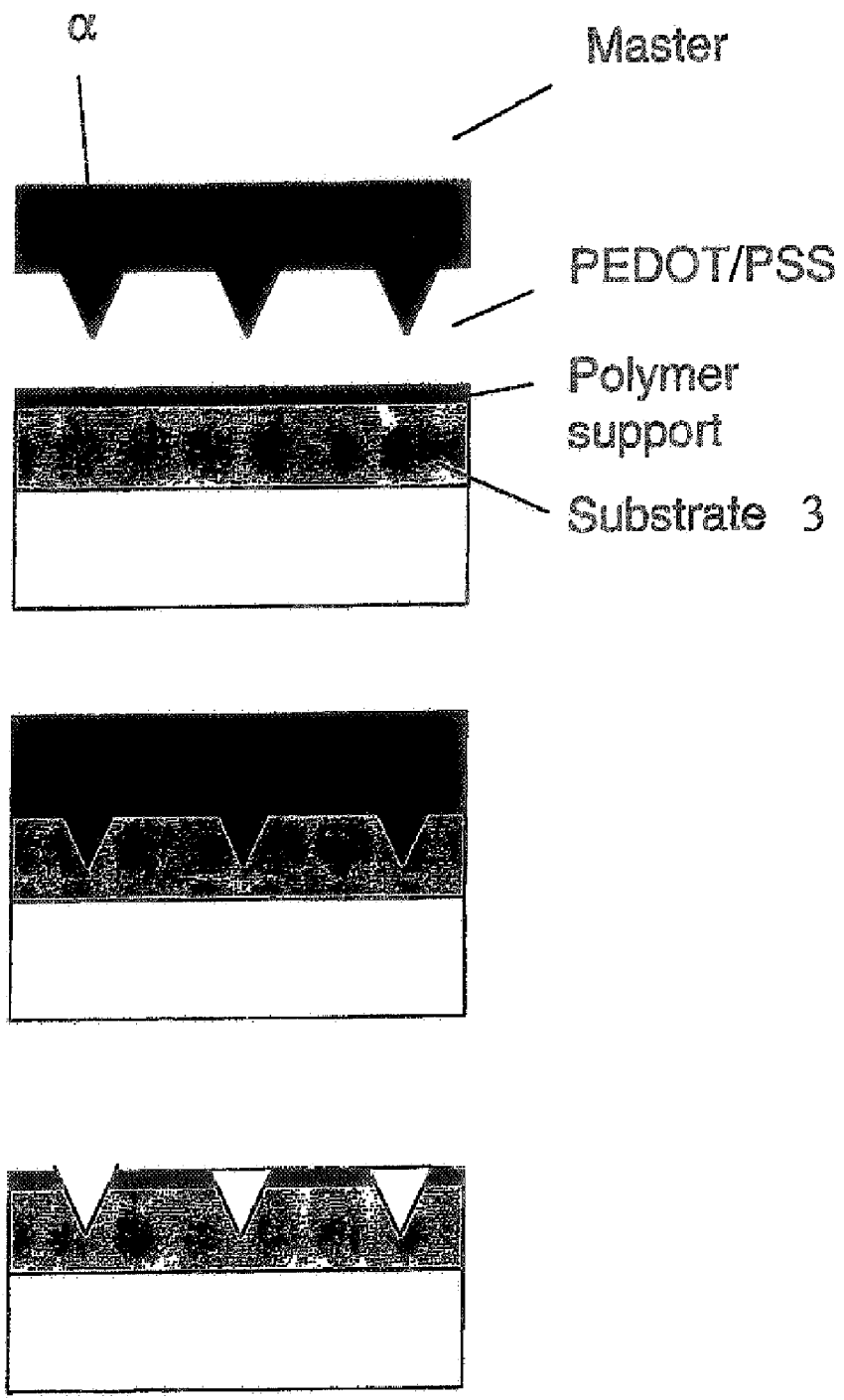
FIG. 1 is a schematic diagram of one embodiment of the solid state embossing and microcutting process.

FIG. 1 shows a schematic diagram of solid state embossing of a thin film of PEDOT/PSS on top of a thick, smooth insulating polymer support such as PMMA, poly(vinylphenol) (PVP), poly(styrene) (PS) or polyimide (PI). The insulating polymer film is deposited on top of the 7059 glass substrate by spin coating from a 15-30 weight % solution in propylene glycol methyl ether acetate (PVP) and cyclopentanone (PMMA), respectively, resulting in a film thickness of 2-3 µm. Prior to the deposition of the PEDOT the surface of the insulating polymer is rendered hydrophilic by $O_2$ plasma treatment in order to promote the adhesion of the PEDOT film. A 800 Å film of PEDOT/PSS (Baytron P from Bayer corporation) is then spincoated from a water dispersion. Embossing is performed at a temperature of 150° C. (PVP), 100° C. (PS), 105° C. (PMMA) for up to 60 min with a load of about 1 kg/mm$^2$. Other processing conditions have also been shown to yield satisfactory results. Subsequently, the sample is cooled to room temperature before the pressure and the master are removed.

Critical in the method according to the present invention, is that during the microstructuring process the polymer substrate 3 is in its solid state. Accordingly, for amorphous polymers the method is carried out around the glass transition temperature, $T_g$. The latter temperatures generally are well known and can be found for instance in Polymer Handbook (Eds., J. Brandrup, H. Immergut, E. A. Grulke, John Wiley & Sons., New York, 1999), or can readily be determined according to standard thermal analysis methods. Preferably, the microstructuring process according to the present invention is carried out in a temperature range from about 50° C. below to about 50° C. above $T_g$ and more preferably from about 40° C. below to about 40° C. above that transition. Most preferred is the temperature range from about 25° C. below to about 25° C. above $T_g$. For semi-crystalline polymers the microstructuring method according to the present invention is carried out in the temperature regime between about the glass transition temperature, $T_g$, and the melting temperature, $T_m$. The latter temperatures generally are also well known and can also be found for instance in Polymer Handbook, or can readily be determined according to standard thermal analysis methods. Preferably, the microstructuring process is carried out in a temperature range from about 50° C. below $T_g$ to 1° C. below $T_m$, and more preferably from about 25° C. below $T_g$ to 2° C. below $T_m$. Most preferred is the temperature range from $T_g$ to about 5° C. below $T_m$. Other processing parameters, such as the load that is applied onto the master and time period during which it is applied, are less critical and are readily adjusted to ensure that the desired penetration of the master through one or more of the layers 2a is effected.

One of the other important features of the process is that the master or the substrate to be embossed can be in contact with a soft rubbery material through which the pressure during the embossing is transmitted in a homogeneous way, such that a homogeneous depth of microgrooves is obtained across the substrate.

It should be noted that a conducting polymer film such as poly(3,4-ethylenedioxythiophene) protonated with polystyrene sulfonic acid (PEDOT/PSS) has very different mechanical and elastic, as well as adhesive properties than a hard, polycrystalline film of an inorganic metal such as gold or silver. Therefore, techniques for processing hard films are not generally extensible to polymer film processing.

Figure 2:
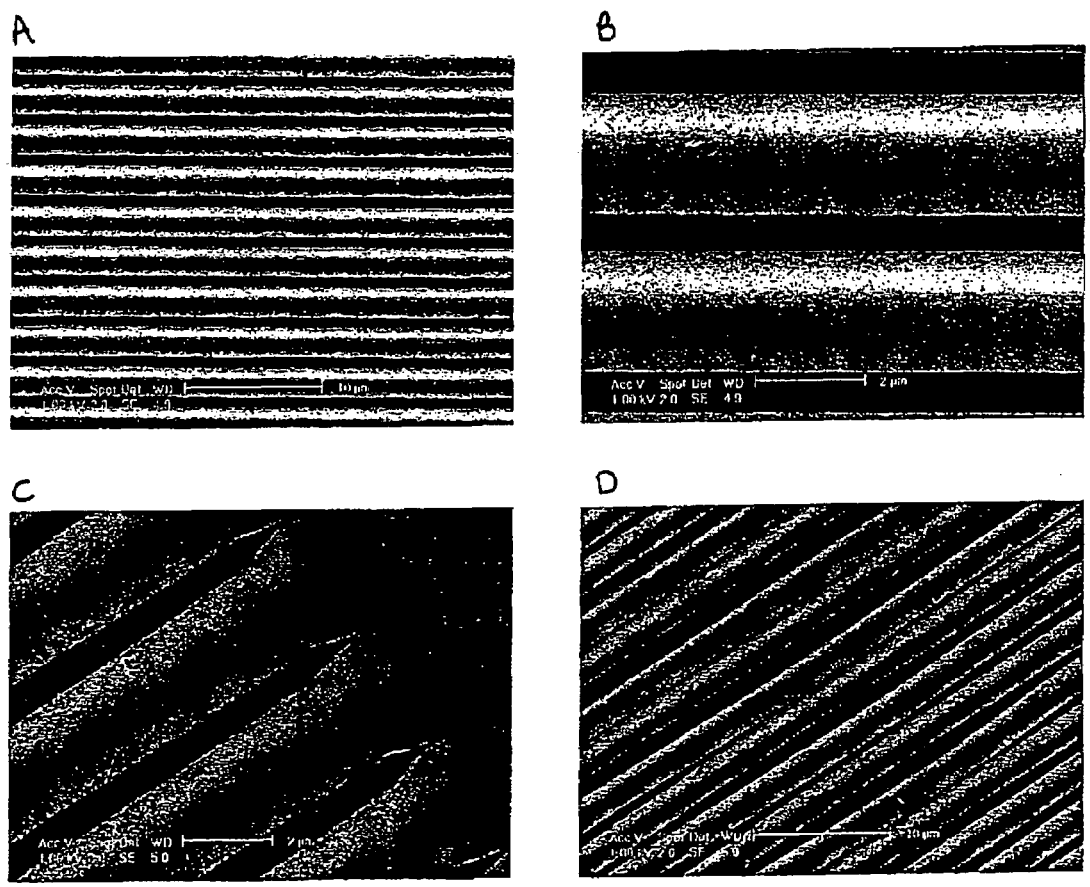
FIG. 2 shows environmental scanning electron microscopy images of microcut PEDOT films on different polymer supports (A/B: 800 Å PEDOT on top of 3 μm PMMA; C/D: 800 Å PEDOT on top of 3 μm PVP). The bright areas are those covered with PEDOT.

FIG. 2 shows environmental scanning electron microscopy (ESEM) images of a microcut PEDOT film on PMMA. The silicon master in this case consists of a parallel array of sharp wedge-shaped protrusions. The lateral size of the microcut grooves, i.e., the separation gap between the PEDOT electrodes, is determined by the shape of the wedge and the indentation depth. We have fabricated patterns of parallel stripes of PEDOT separated by microgrooves with gaps down to 0.6 µm and indentation depths of about 1.5 µm using a wedge with an opening angle α of 70° (FIG. 2).

In some cases it was found that only every second line had been microcut (see FIG. 2D). In some circumstances this might be acceptable, but if it is to be avoided it has been found helpful to promote the adhesion of the PEDOT layer to the underlying polymer support, for example by making use of adhesion promoters or plasma treatment of the polymer support prior to deposition of the PEDOT.

Another example demonstrates a method by which solid-state embossing can be combined with direct printing to define all-polymer transistor devices and integrated TFT circuits. We use microcutting of conducting polymer films to accurately define the active channel region between the source and drain electrodes of the TFT with submicrometer resolution. We combine solid state embossing with direct printing techniques such as inkjet printing or screen printing. This allows us to fabricate discrete TFT devices and arbitrary integrated circuits, with areas in between devices that do not contain conducting material. Note that microcutting in combination with thin film deposition techniques such as evaporation, spin-coating or blade coating is capable only of removing conducting material in small areas. The following features are significant:

Combination of microcutting with direct printing: To define conducting coarse patterns on the substrate prior to embossing a broad variety of printing techniques may be used. Conducting polymer electrodes may be deposited directly by techniques such as inkjet, or screen printing or micromoulding techniques. In order to increase the electrical conductivity of the electrodes it is possible to use the printed conducting polymer pattern as a template for the subsequent electrodeposition of an inorganic metal. In this case a double layer of conducting polymer and inorganic metal film is microcut. Alternatively, a layer may be printed (by inkjet or microcontact printing, for example) that can subsequently be used to initiate electroless plating of a conducting layer (H. Kind, et al., Langmuir 2000, 6367 (2000)). Yet another possibility is the direct printing of a solution-processible precursor to a conducting layer such as an organometallic compound or a colloidal suspension of conducting particles (Kydd, et al., WO 98/37133).

Figure 3:
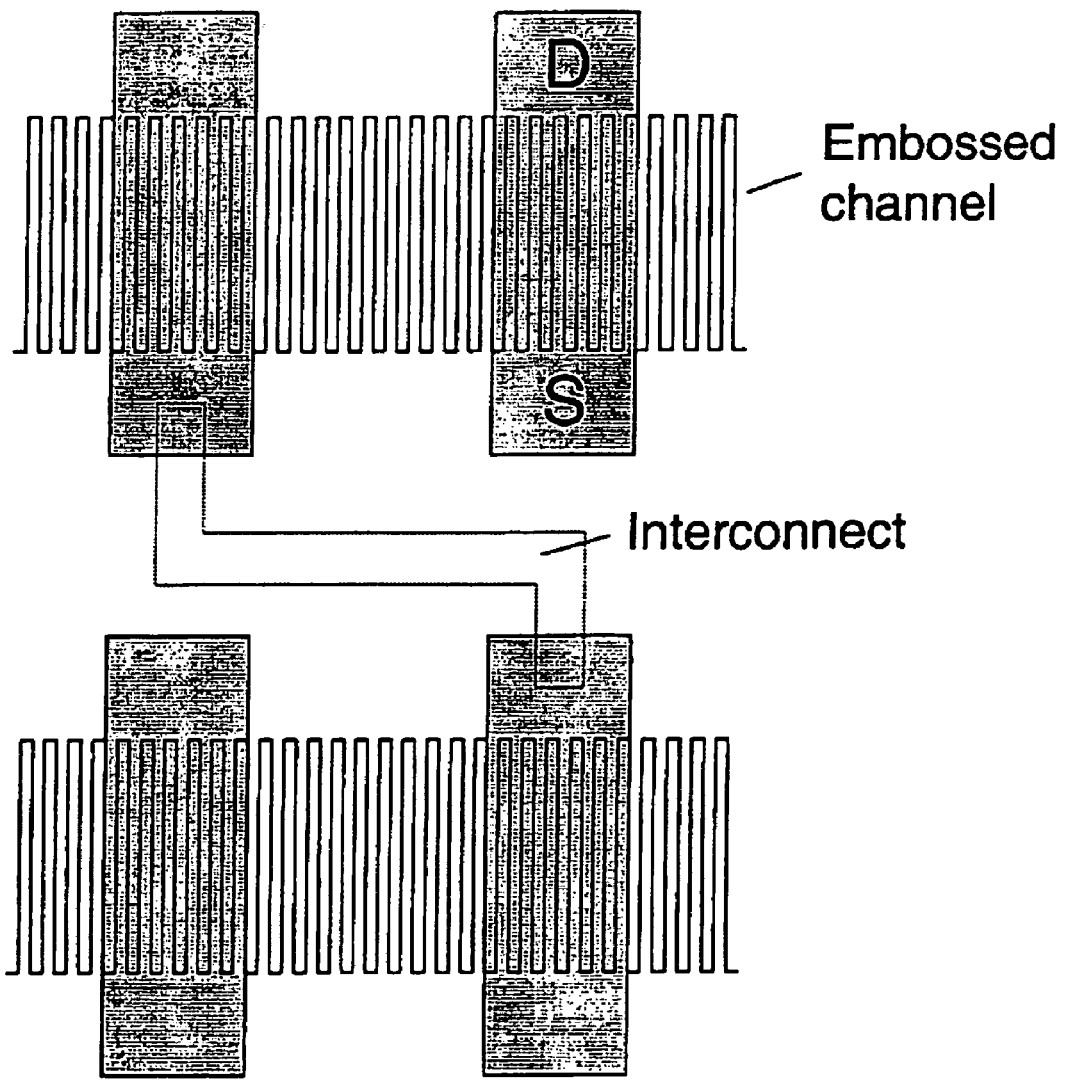
FIG. 3 a schematic top view of a possible source-drain electrode configuration to fabricate a regular array of discrete TFT devices by combining direct printing with solid state embossing. For integrated circuit fabrication interconnects between any two TFT devices can be defined by direct printing, as indicated by the dashed line.

In a second step the electrode pattern is then microcut by solid state embossing to define the small source (S)—drain (D) separation. FIG. 3 shows a possible structure in which an array of simple rectangular electrode patterns and interconnect lines is deposited by direct printing, which is then embossed with a master containing wedges that define interdigitated source-drain electrodes. Interdigitated electrodes are advantageous since they allow formation of TFTs with large channel width over a small area. Arbitrary and more complex source-drain electrode patterns can be fabricated in this way.

Registration: In principle, the embossed channel has to be aligned accurately with respect to the previously deposited coarse electrode pattern. This may be achieved by performing the embossing step in a mask aligner with optical positioning. However, registration issues can be largely overcome by defining periodic TFT arrays such as the one shown in FIG. 3 in which the master and the coarse electrode pattern are periodic in one or two directions. In this case alignment requirements are less critical. To fabricate integrated TFT circuits the individual TFTs of the array can be connected by printed interconnect lines and via-hole interconnects (see below).

Figure 4:
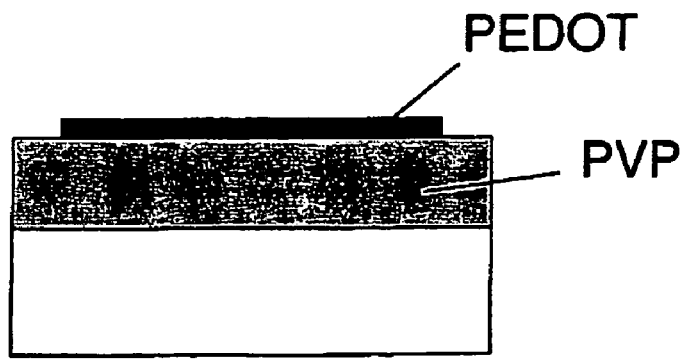
FIG. 4 shows a schematic diagram of the process sequence for fabricating a top-gate polymer TFT by a combination of solid state embossing and direct printing.
Figure 4:
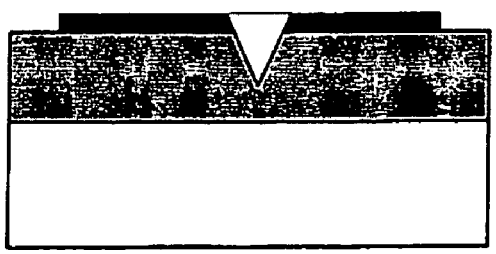
Figure 4:
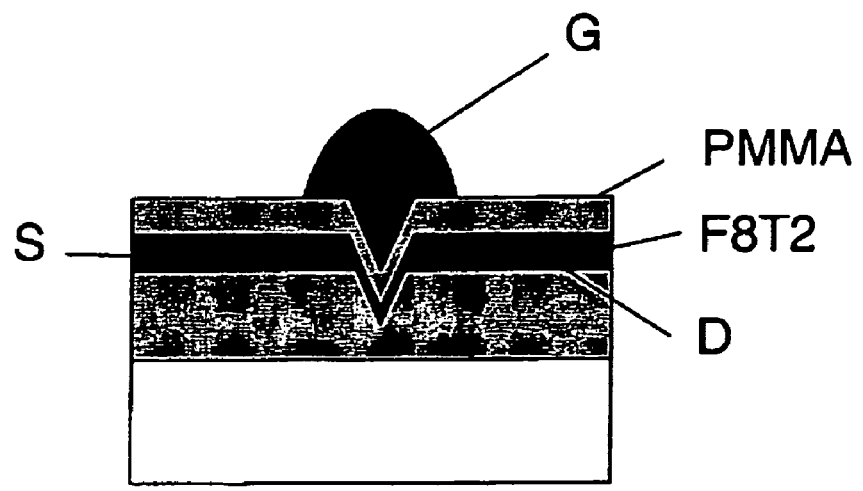

Electrical and structural integrity: In order to avoid damage to the TFT layers, in particular to the insulating gate dielectric, by the embossing step, we choose a top-gate TFT structure in which the TFT layers are formed on top of and after the embossed source-drain pattern. As shown in FIG. 4 thin layers of the semiconducting polymer and the gate insulating polymer are deposited from solution followed by direct printing of a conducting polymer gate electrode (G). For conjugated polymers with a low bulk conductivity patterning of the semiconducting polymer layer is not required. The formation of this layer structure requires careful choice of solvents in order to avoid dissolution and swelling of underlying layers. However, it has been shown that adequate structural integrity of the different polymer-polymer interfaces of the TFT can be achieved using an alternating sequence of polar and non-polar solvents (H. Sirringhaus et al., UK 0009911.9). One possible sequence of materials is indicated in FIG. 4.

Structural self-organisation: In order to obtain a high charge carrier mobility the semiconducting polymer layer needs to be highly ordered which can be achieved by making use of self-organisation mechanisms. Various self-organising semiconducting polymers can be used such as regioregular poly-3-hexylthiophene (P3HT), and polyfluorene co-polymers such as poly-9,9'-dioctylfluorene-co-dithiophene (F8T2). In devices such as that in FIG. 4 the channel is formed within the embossed microgrooves. The topographic profile of the groove may be used to induce alignment of the semiconducting polymer. Double embossing may also be used. The polymer support can be embossed once prior to deposition of the PEDOT S/D layer in order to define microgrooves in the polymer support parallel to the TFT channel. Since embossing is performed in the solid state, this relief is maintained during the second orthogonal embossing step to define the channel (N. Stutzmann et al., Adv. Mat. 12, 557 (2000)). If a liquid-crystalline semiconducting polymer such as F8T2 is used (H. Sirringhaus et al., Appl. Phys. Lett. 77, 406 (2000), alignment of the polymer chains predominantly parallel to the TFT channel can be induced using the first embossing pattern as an alignment layer (J. Wang, et al., Appl. Phys. Lett. 77, 166 (2000)).

Another example demonstrates a method to define vertical side walls in polymer multilayer structures, which can be used to fabricate vertical polymer TFT devices.

In a vertical TFT (see for example, A. Saitoh, et al. Jpn. J. Appl. Phys. 36, 668, (1997)) the channel length is defined by the thickness of one of the deposited layers as opposed to a high-resolution patterning step in the case of a planar TFT. In one possible configuration a mesa-type structure is deposited first consisting of source and drain electrode layers separated by a thin dielectric layer the thickness of which determines the channel length of the TFT. A vertical side wall is then formed by appropriate means such as a chemical etching process. Semiconducting and insulating layers are deposited onto the side walls followed by a gate electrode. Vertical TFTs have been fabricated using inorganic materials. They are useful because they allow formation of submicrometer channel lengths without requiring expensive lithographic tools, but offering enhanced circuit speed and drive currents.

Vertical polymer TFTs have not hitherto been demonstrated, because of the difficulties associated with forming vertical sidewalls and conformal solution coating of polymer layers onto a truly vertical side wall. Chemical etching methods for forming side walls pose problems because of the high solubility of polymers in common organic solvents and the lack of anisotropic etching mechanisms that in the case of inorganic semiconductors cause etching to proceed faster in one crystallographic direction that in others allowing formation of well defined facets. More directional, physical etching methods such as reactive ion etching suffer from degradation of electrically functional polymers upon plasma exposure.

Figure 5:
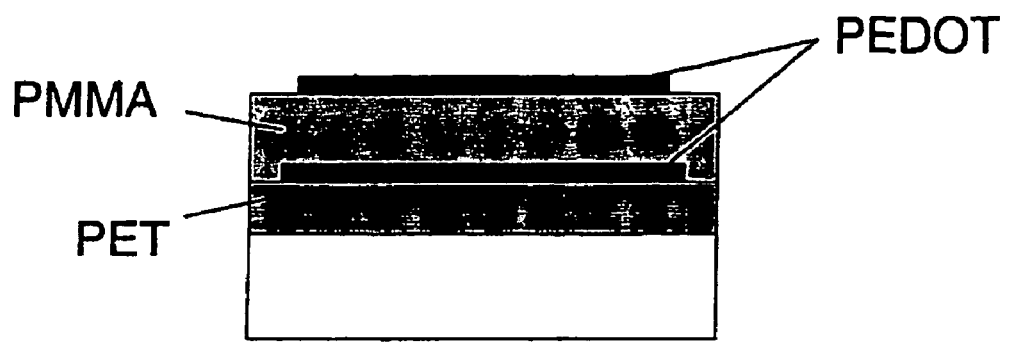
FIG. 5 shows a possible process sequence for fabricating a vertical polymer TFT by solid state embossing.
Figure 5:
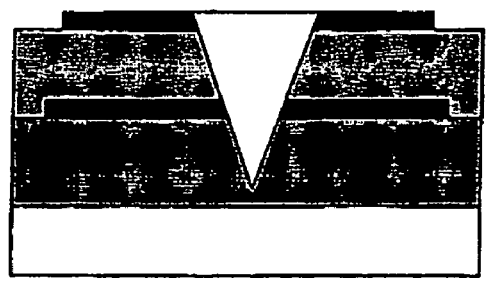
Figure 5:
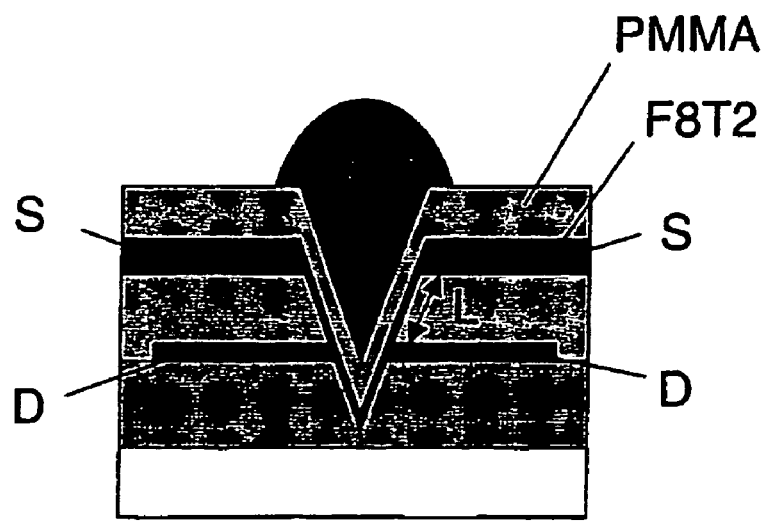

Solid state embossing provides a new method to overcome these polymer specific difficulties and define side walls in a well controlled way. FIG. 5 shows the structure of a vertical polymer TFT in which the channel is formed on the pseudo vertical inclined side wall of an embossed microgroove. The initial layer structure consists of two conducting polymer layers that have been coarse-patterned by direct printing separated by an insulating polymer layer such as a layer PI or PVP. The insulating layer can be deposited by spin coating. The thickness of the insulating spacer layer should be less than 2 $\mu$m, preferably less than 1 $\mu$m, most preferably less than 0.5 $\mu$m. The minimum thickness, i.e. channel length that can be achieved in this way, is limited by frictional forces between the master and the polymer layers. Friction tends to cause a downward movement of the lips of the upper conducting polymer layer during embossing. This may cause electrical shorts between the two conducting polymer layers if the thickness of the spacer layer is too small. Friction can be minimized by chemical modification of the master, such as deposition of a functional self-assembled surface monolayer to minimize adhesion between the master and the polymer layers or other friction-reducing lubricants. After the embossing step the device can be completed by depositing a conformal layer of semiconducting polymer and gate insulating polymer. Conformal coating is facilitated by the finite inclination of the side wall that is defined by the opening angle $\alpha$ of the master. Finally a gate electrode pattern can be printed into the microgroove overlapping with the side walls. With suitably defined printed source-drain patterns TFT operation may be obtained on both side walls of each microgroove.

Vertical transistors according to one embodiment of the present invention were fabricated in the following way: First, amorphous polyethylene terephthalate, PET, films (thickness=0.25 mm; Goodfellow) were cleaned by sonication in xylene (Aldrich) and subsequent oxygen-plasma treatment for 60 sec at 50 Watt. Then, pre-structured gold pads of 1×5 mm size and a thickness of 40 nm were thermally evaporated utilizing a suitable shadow mask. Spin-coating a 10 wt % poly(vinylphenol), PVP ($M_w \approx 20$ kg mol$^{-1}$, $T_g \approx 151°$ C.; Aldrich) solution in isopropanol, IPA (Aldrich) at 2000 rpm for 60 sec yielded an approximately 1 □m thick insulating film on top of these gold pads. Subsequently, a second set of gold pads were evaporated in the same way as described above, however these pads were shifted slightly with respect to the formerly produced ones to enable their addressing. The two gold and the PVP layer were then microcut on the PET substrate in order to define the source/drain electrodes by embossing the multilayer system at 80° C. with a microcutting tool fabricated as described above, applying a nominal pressure of 1 kg mm$^{-2}$ for 30 min. For this purpose, a Tribotrak pressing apparatus (DACA Instruments) was employed. The vertical transistors were then completed by first spin-coating a 8 wt % solution of the semi-conducting polymer, poly(3-hexylthiophene), P3HT (supplied by R. A. J. Janssen, TUE Eindhoven, The Netherlands) in anhydrous xylene (Romil Ltd.) at 2000 rpm for 60 sec, then a 7 wt % poly(methyl methacrylate), PMMA ($M_w \approx 120$ kg mol$^{-1}$, $T_g \approx 105°$ C.; Aldrich) solution in anhydrous butyl acetate (Romil Ltd.) also at 2000 rpm and for 60 sec, and, finally, thermally evaporating another set of gold electrodes through the same shadow mask to define the gate electrode.

Figure 9:
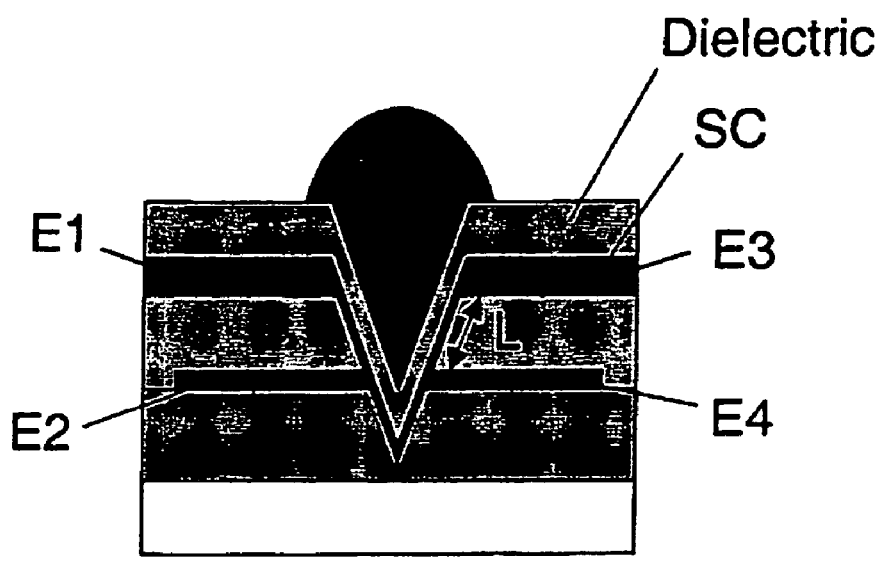
FIG. 9 shows another schematic diagram of a multilayer structure for fabrication of vertical transistors and a photograph of a completed transistor with a triple layer of embossed gold/1 μm PVP/gold.
Figure 9:
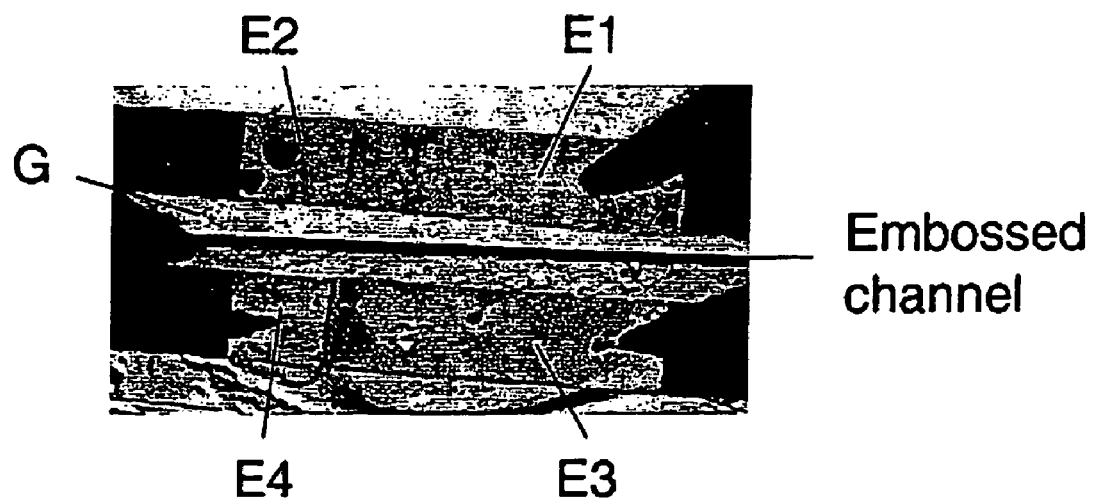
Figure 10:
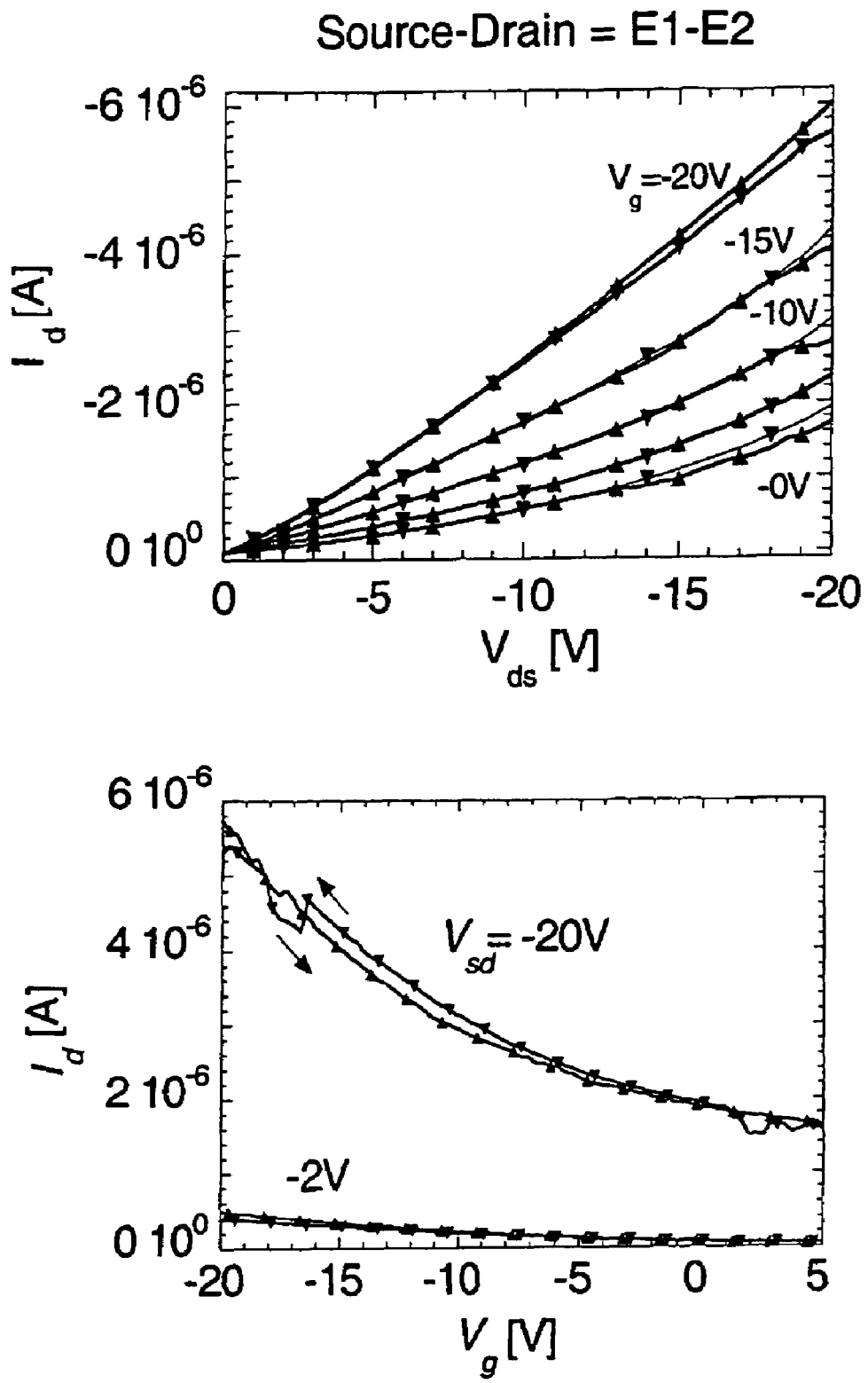
FIG. 10 shows output and transfer characteristics of a vertical, embossed polymer transistor measured with electrodes E2 and E3 as source-drain electrodes.
Figure 11:
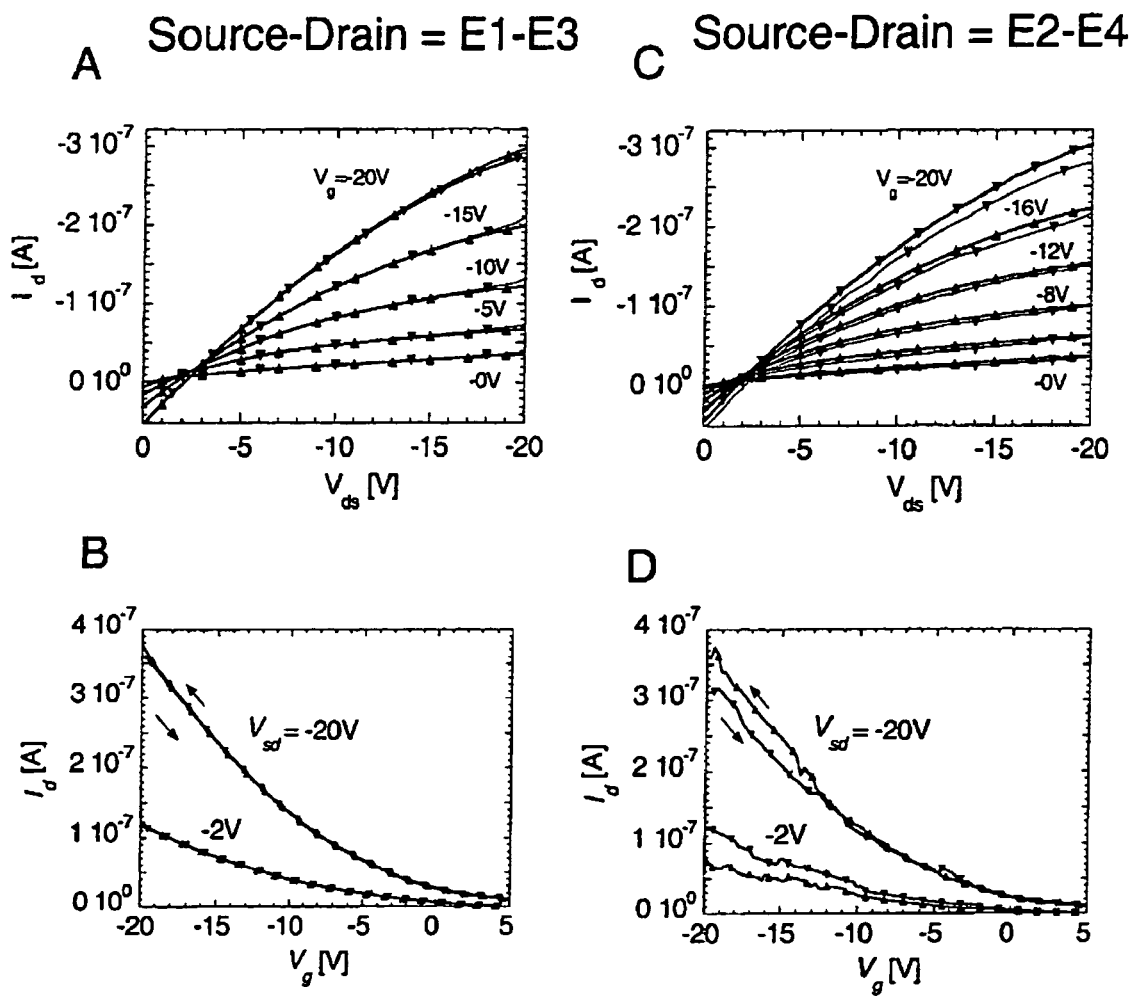
FIG. 11 shows output and transfer characteristics of a planar, embossed polymer transistor measured with electrodes E2 and E4 as source-drain electrodes.

FIG. 10 shows output and transfer characteristics of such a vertical polymer TFT fabricated by microcutting a double layer of gold electrodes separated by a thin layer of polyvinylphenol on a PET substrate (see FIG. 9). The semiconducting polymer layer in this example is a layer of regioregular poly-3-hexylthiophene (P3HT) with a gate dielectric layer of PMMA deposited on top. Clean p-type accumulation operation can be observed. Although care was taken to minimize doping of the P3HT by avoiding exposure of the P3HT to atmosphere (processing under inert nitrogen atmosphere) the device is normally on due to some residual doping of the P3HT. However, most significantly, no shorts are observed between the top and bottom source-drain electrodes which is clear evidence that the microcutting technique is capable of preserving the integrity of a multilayer stack without generating electrical shorts in different layers.

Figure 13:
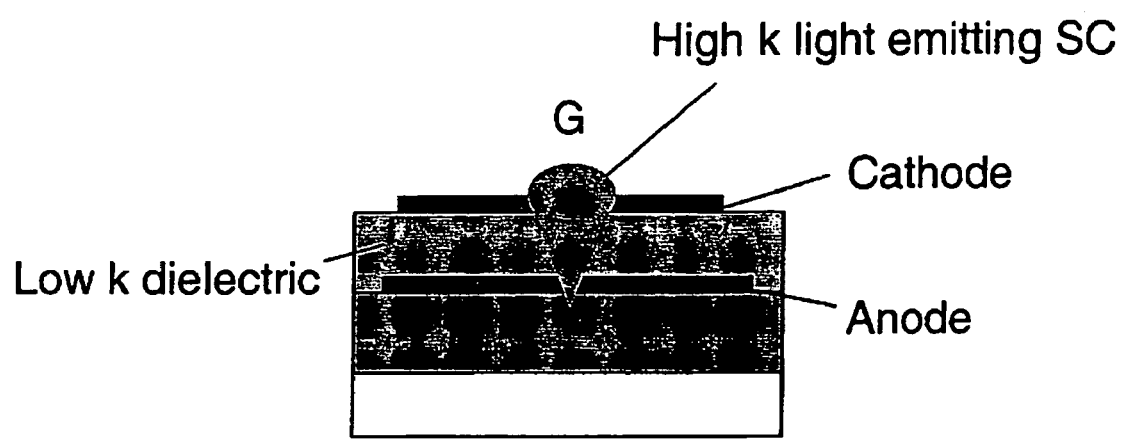
FIG. 13 shows a light emitting diode device fabricated on a vertical side wall that also forms an optical waveguide structure.

This opens the way to a broad range of device applications in which microcutting can be used to define vertical sidewalls with electrodes in different layers. Examples of other useful structures with such vertical side walls are vertical light emitting diodes with anode and cathode (formed from different materials) stacked on top of each other (see FIG. 13). If such a microcut groove is filled with a light emitting material such as a conjugated polymer with a refractive index higher than that of the substrate and that of the dielectric polymer spacer layer separating anode and cathode the light from the LED can be coupled into the waveguide. The light might be guided within the embossed groove to some other location on the same substrate where it might be detected by a vertical photodetector formed by the same method as the LED. This provides a simple fabrication method for integrated optical communication circuits.

Figure 14:
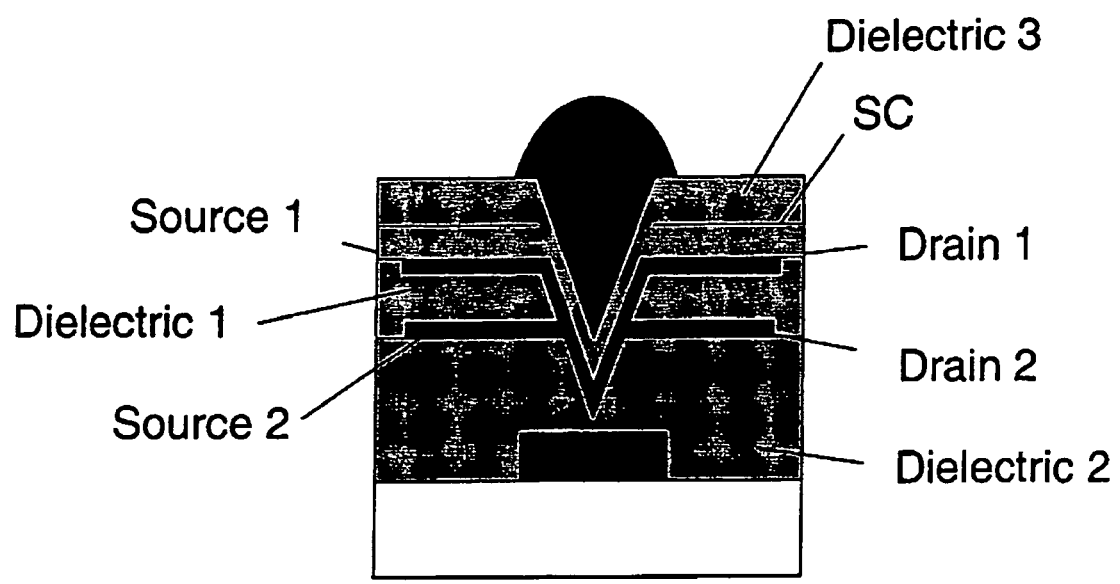
FIG. 14 shows an electrically driven laser device with n- and p-type transistor channels that provide electron and hole injection into the light emitting semiconductor material.

Another useful device that can be fabricated in this way is an electrically driven laser. Recently electrically driven lasers based on organic single crystals have been demonstrated (Schön et al., Science 289, 599 (2000)). The device architecture is based on TFT devices formed on both sides of the organic single crystal providing injection of electrons and holes from opposite sides of the crystal. Waveguiding is achieved along the parallel channel of the TFTs by the high refractive index of the gate electrode. However the method of fabrication requiring accurate alignment of devices on opposite sides of the crystal is not suitable for integration. Here we propose a method for fabricating a similar device architecture by solid state embossing that is more suited for integrated circuit fabrication. A schematic drawing is shown in FIG. 14. The p-channel can be formed on the bottom side of the semiconducting layer deposited into the microembossed groove, while the n-channel can be formed on the top of the layer or vice versa. Waveguiding of the emitted light can be achieved as described above. Optical feedback that is required for laser action can, for example, be achieved by depositing the layer sequence onto a substrate that had previously been embossed with grooves in a direction perpendicular to the laser waveguide.

Figure 15:
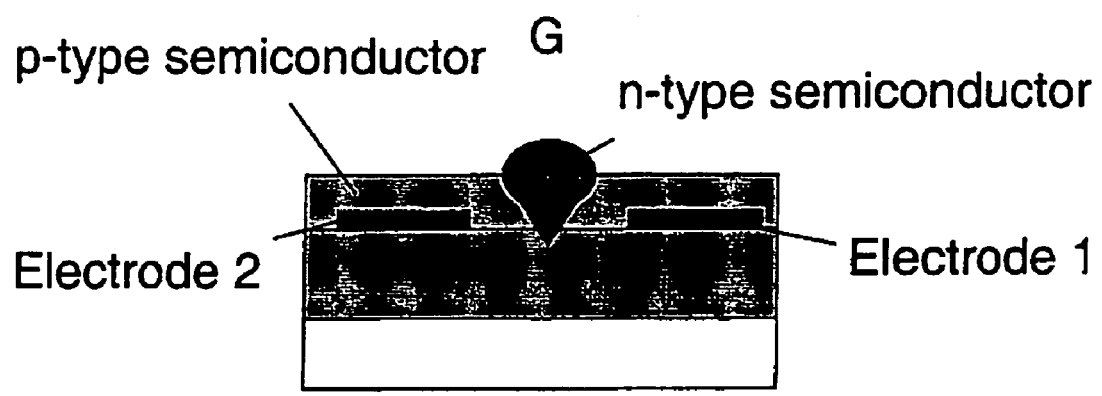
FIG. 15 shows a device with a lateral p-n junction formed in the microcut groove.

Vertical side walls may also be used to form well-defined interfaces between semiconducting layers such as lateral p-n junctions as shown in FIG. 15.

Another example demonstrates a method for forming surface relief features that can be used to fabricate surface free energy patterns that direct and confine the solution deposition of polymer patterns.

Many direct printing techniques to deposit polymer patterns suffer from a relatively low resolution that prevents the formation of fine-scale features and lines with dimensions of a few micrometers. In the case of inkjet printing, for example, the resolution is limited to 20-50 μm by the uncontrolled spreading of inkjet droplets on the substrate and statistical variations in flight direction. It has been shown that the resolution can be significantly enhanced by printing onto a substrate that contains a prefabricated pattern of surface free energy. In the case of PEDOT/PSS deposited from water solution the spreading of droplets can be controlled by using hydrophobic repelling banks such that the PEDOT deposition is accurately confined to the hydrophilic surface regions. Different techniques have been demonstrated to fabricate such a surface free energy pattern, such as photolithographic patterning of a hydrophobic polyimide layer on top of a hydrophilic glass substrate or photopatterning of a self-assembled monolayer (H. Sirringhaus et al., UK 0009915.0).

Another technique to generate a surface free energy pattern is soft lithographic stamping (see for example, Y. Xia, et al., Angew. Chem. Int. Ed. 37, 550 (1998)). Here a soft stamp containing surface relief features is fabricated by pouring a solution of poly(dimethylsiloxane) (POMS) over a patterned master. After curing and peeling off the master the stamp is exposed to a solution of a self-assembled monolayer (SAM) and is then brought into contact with the sample surface. The SAM is selectively transferred to the sample in those regions which are in direct contact with the stamp resulting in local modification of the surface free energy.

Solid state embossing provides an elegant, self-aligned method for confining the deposition of material to the embossed microgrooves by making use of the topographic relief features generated by the embossing step.

If a solution of material is deposited onto a substrate containing microgrooves the solution will be drawn into the microgrooves by capillary forces. This provides a mechanism for the selective deposition of material in the microgrooves.

This effect can be enhanced by modifying the surface energy of the substrate. If the embossed sample is brought in contact with a flat soft stamp that has been exposed to a self-assembled monolayer, transfer of the SAM only occurs in the planar surface regions, but not on the side walls of the microgrooves. Flat stamps can be fabricated by using the materials and procedure developed for soft lithography, without the need for a surface relief, i.e. a pattern on the master.

Figure 6:
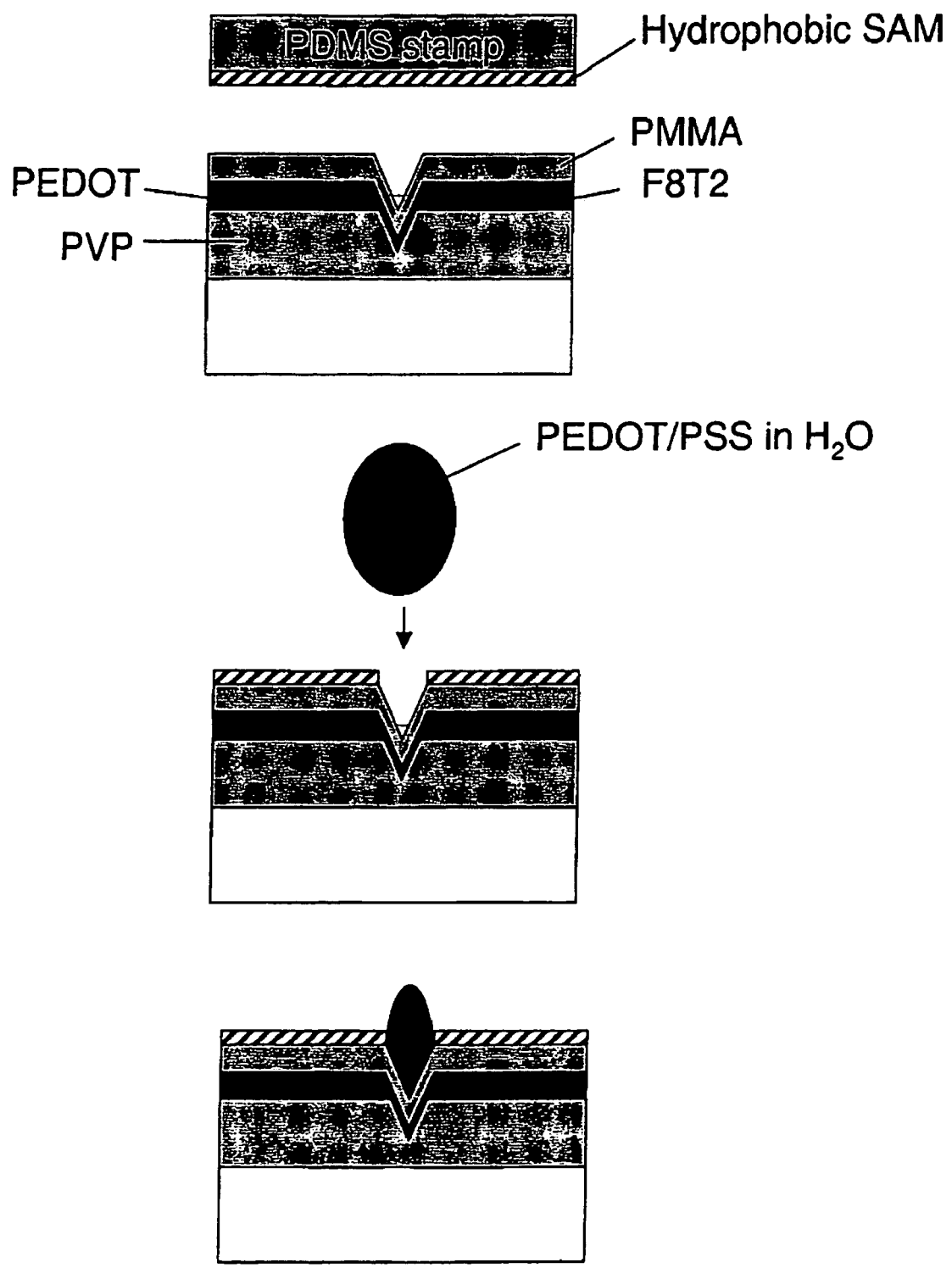
FIG. 6 illustrates a method for fabricating self-aligned gate electrodes for polymer TFTs by a combination of solid state embossing and selective surface modification.

One of the attractive advantages of this technique as opposed to soft lithography is that it does not require any alignment or registration with respect to a previously deposited pattern. It allows for example an elegant way to fabricate a self-aligned surface free energy pattern for the printing of the gate electrode of the TFT as shown in FIG. 6. If the planar surface regions of the gate insulating layer are modified to be hydrophobic the deposition of an inkjet printed gate electrode, for example of PEDOT/PSS in water, is confined to the microgrooves without spreading into the hydrophobic surface regions. This allows fabrication of a self-aligned TFT with small overlap capacitance between source/drain and gate electrodes. This feature is particularly useful in the context of vertical TFTs, because the self-alignment of printed gate electrodes provided by the topographic groove overcomes one of the general problems of vertical transistor device architectures. Most vertical transistors suffer from a large overlap between source-drain and gate electrodes due to the difficult alignment of the vertical metallization. As a consequence of the reduction in capacitance an integrated circuit using embossed vertical transistors will show improved switching times and better fan-out.

One possible choice of materials for such surface patterning is to use a gate insulating layer of PVP. PVP is a moderately polar polymer due to the hydroxyl groups attached to each phenyl ring. Its surface can be made even more hydrophilic by brief oxygen plasma exposure such that the contact angle of water becomes less than 30°. However, PVP is not soluble in water, and allows deposition of a PEDOT/PSS gate electrode from water solution without being dissolved. Its surface can be made hydrophobic by exposure to a self-assembled monolayer of alkyltrichlorosilanes or fluorinated alkyltrichlorosilanes. Contact angles exceeding 60° can be achieved. This contact angle difference is sufficient for confining deposition of inkjet deposited PEDOT/PSS droplets from water solution to the hydrophilic surface regions.

An alternative method of surface modifying the upper part of the structure is to use a vapour process, such as evaporation, in which the vapour is directed at an acute angle to the upper surface. This allows the sides of the recess to shade at least the deeper parts of the recess from the vapour, so that only the upper parts of the recess and the top surface are surface treated.

Figure 7:
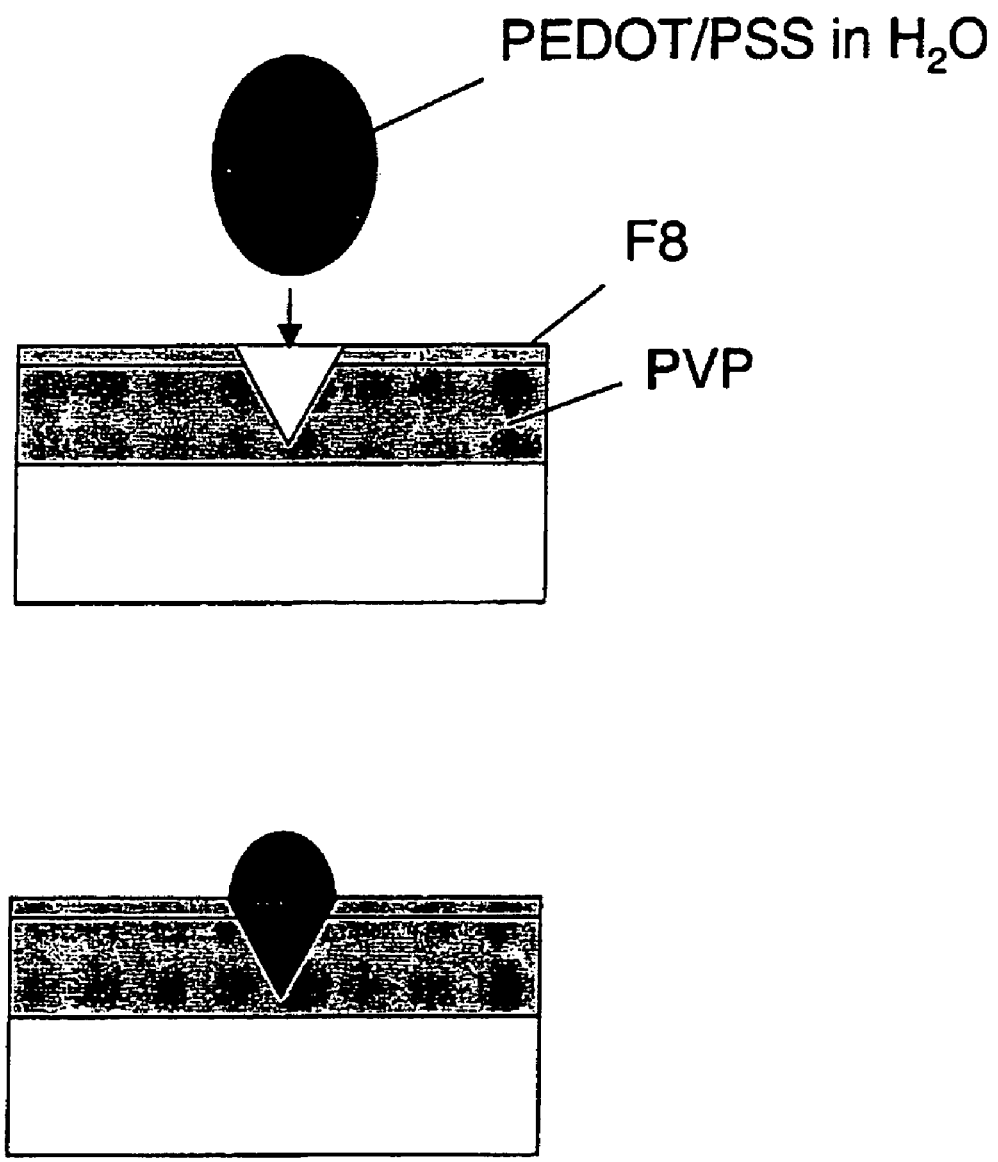
FIG. 7 shows an alternative method for preparation of a surface free energy pattern that can be used to fabricate narrow conducting interconnect lines and electrodes by direct inkjet printing.

An alternative method for such surface prepatterning which does not even require surface modification by stamping is shown in FIG. 7. If a hydrophobic polymer layer such as poly(dioctylfluorene) (F8) is spin coated on top of a hydrophilic polymer layer such as PVP a surface free energy pattern is automatically formed upon embossing when the hydrophilic polymer is exposed on the side walls of the microgrooves. This method can be used in an analogous way to define fine isolated line features in combination with inkjet printing, for example for fabricating high density arrays of fine interconnect lines with arbitrary patterns.

Another example demonstrates a method for the formation of via-hole interconnects.

In order to form integrated TFT circuits using devices of the type described above, it is necessary to make via hole interconnects between electrodes and interconnects in different layers. Different methods to fabricate such via-holes have been demonstrated, such as local etching of dielectric layers using ink-jet printing (H. Sirringhaus, et al., UK0009917.6), photolithographic patterning (G. H. Gelinck et al., Appl. Phys. Lett 77, 1487 (2000)) or serial hole punching using a mechanical stitching machine (C. J. Drury et al., WO99/10929).

Figure 8:
FIG. 8 illustrates fabrication of a via-hole interconnect by solid state embossing.
Figure 8:
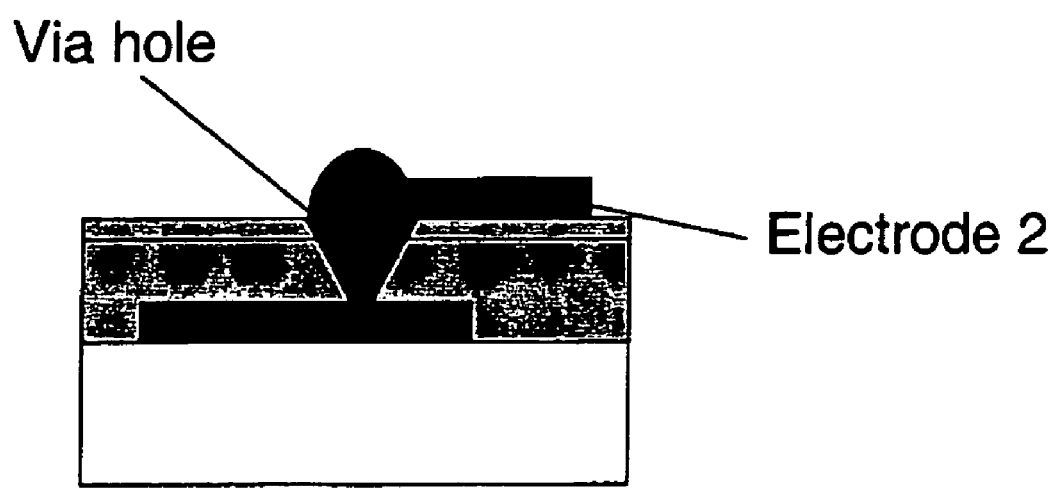

Solid state embossing offers an alternative method to open such via-hole interconnections as illustrated in FIG. 8. If the master contains an array of sharp pyramids (N. Stutzmann et al., Adv. Mat. 12, 557 (2000)) the embossing can be used to generate a small diameter pyramidal microcuts through a dielectric layer exposing the surface of an underlying conducting electrode. The groove can be filled with a conducting polymer in a subsequent printing step. This process can also be applied to more complicated multilayer structures containing sequences of insulating and semiconducting polymer.

The size of the via-hole is defined by the size of the pyramidal wedge and the indentation depth. Using a wedge with an opening angle of 70° via holes with dimensions of a few micrometers or even submicrometer dimensions can be fabricated. Small size of via holes is important for fabrication of high-density integrated circuits.

One of the advantages of such a process is that it allows formation of a large number of interconnects in a parallel way, whereas techniques such as mechanical stitching or inkjet printing are essentially serial.

In all of the above embodiments PEDOT/PSS may be replaced by any conducting polymer that can be deposited from solution. Examples include polyaniline or polypyrrole. However, some of the attractive features of PEDOT/PSS are: (a) a polymeric dopant (PSS) with inherently low diffusivity, (b) good thermal stability and stability in air, and (c) a work function of $\approx 5.1$ eV that is well matched to the ionisation potential of common hole-transporting semiconducting polymers allowing for efficient hole charge carrier injection.

The microcutting tool has microcutting protrusions on it. These suitably take the form of sharp protruding features, such as ridges, saw-tooth-type structures, spikes, and the like. The process of the manufacturing and the material of these microcutting tools are not critical to the microcutting process. However, the material of which the tool is made should be sufficiently hard, and the protrusions sufficiently sharp that the tool is capable of cutting through the layers. Where the tool is to cut through an upper layer of a multi-layer structure the height h of the features should exceed the thickness d of the layer or layers that are to be cut Characteristic dimensions of these features, such as the feature height h, preferably are in the range between 1 mm and 1 nm. More preferably these characteristic dimensions are between about 100 μm and 5 nm, and most preferably between 10 μm and about 10 nm. To provide suitable sharpness the radius of curvature of the protruding edges of these features should be preferably less than 500 nm, more preferably less than 100 nm, and most preferably less than 10 nm.

The sharp protruding features may be of simple geometries (e.g. line-shaped ridges) or more complex such as interdigitated features. Examples of suitable geometries include arrays of conical or pyramidal protrusions, and arrays of linear protrusions. One useful configuration is for the protrusions to be linear and parallel to each other.

Figure 12:
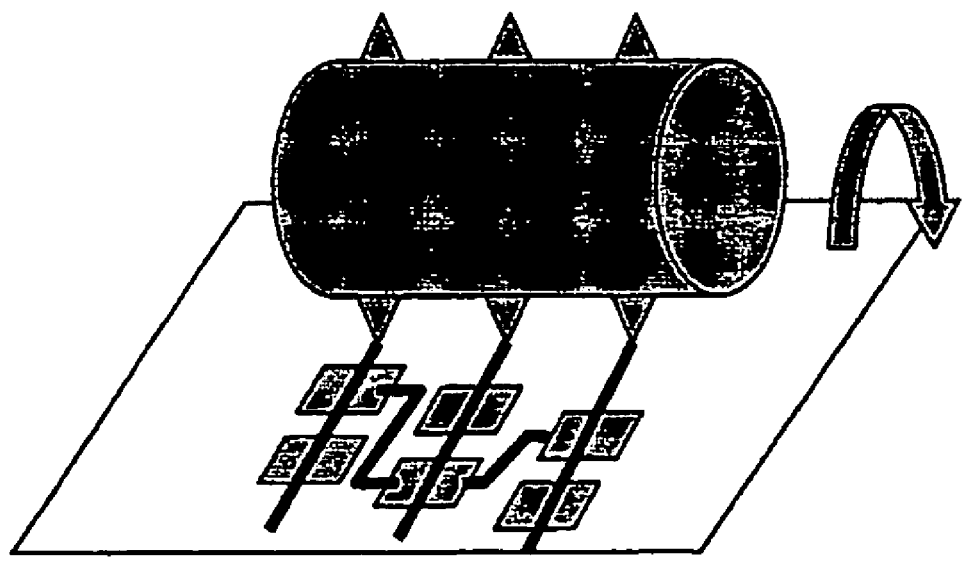
FIG. 12 shows a cylindrical microcutting tool used to emboss a continuous, flexible substrate in a reel-to-reel process.

The microcutting tool suitably comprises at least one cutting edge, but preferably a multitude of edges. The latter allows for fabrication of a multitude of devices in one single embossing/microcutting step. The protruding edges may all be of the same geometry or may differ from each other. For instance, a microcutting tool according to the present invention may comprise arrays of line-shaped edges (c.f. schematic top view FIG. 12) with which for example pre-structured electrical-conductive layers on top of a polymeric substrate (FIG. 12) can be cut in one step leading to an array of electrodes e.g. for use in electrical devices such as thin-film transistors.

In another example the microcutting master could be either planar or cylinder-shaped or could have whatever geometry is best suited for the device and device configuration to be fabricated as well the fabrication process. Cylinder-shaped microcutting tools are particularly useful as they allow for embossing of a continuous flexible substrate in a reel-to-reel process (see FIG. 12). Reel-to-reel fabrication may offer higher throughput, and lower cost capability than a standard batch process. In this context it is of particular significance that the embossing is performed preferably in the solid state, in which the embossed grooves retain their shape after the embossing tool is retracted. If the embossing were performed in the liquid phase, it would be necessary to reduce the substrate temperature before removing the microcutting tool, which would be difficult to achieve with a rolling cylindrical microcutting tool. The flexible tool could be constituted by a flexible plastics structure, or could be a flexible sheet of another material, for instance a thin (e.g. 20 micron thick) sheet of silicon.

Large-area microcutting tools according to one embodiment of the present invention can be fabricated for instance by combining a multitude of microcutting tools comprising the same or different relief structures (see FIG. 16). Cylinder-shape microcutting tools may be fabricated by first producing a planar tool which is subsequently rolled or bended (see FIG. 16).

Suitable masters can be made by a variety of methods known in the art, including, but not limited to anisotropic etching techniques, lithographic methods, electroplating, electroforming and the like. It is most preferred within the scope of the present invention to apply anisotropic etching techniques to fabricate suitable features, as these techniques can lead to features having edges of a radius of curvature of less than 10 nm in a most straight-forward way. In particular, anisotropic etching of single-crystalline or polycrystalline inorganic materials is contemplated in the scope of this invention. A most suitable material is, but the present invention is not limited to, single-crystalline {100} silicon, for which anisotropic etchants such as solutions of potassium hydroxide (KOH) or tetramethyl ammonium hydroxide (TMAH) in water, with or without the addition of isopropyl alcohol (IPA) can be used. Other materials different from {100} silicon and anisotropic etchants different from those listed above might be employed e.g. to vary e.g. etch angles or etching rate; these will be apparent to those ordinarily skilled in the art of microfabrication. Also, for fabricating more complex structures, such as rectangular-shaped corners needed for example for producing interdigitated features, anisotropic etching techniques incorporating different compensation structures might be applied which are designed such that corners are protected by a "sacrificial" beam or similar structure until the desired etch depth is reached. These etching-techniques are also well-known (cf. van Kampen, R. P. and Woffenbuttel, R. F. *J. Micromech. Microeng.* 5, 91 (1995), Scheibe, C. and Obermeier, E. *J. Micromech. Microeng.* 5, 109 (1995), Enoksson, P. *J. Micromech. Microeng.* 7, 141 (1997)).

Anisotropic etching of silicon can suitably be used to produce a die for use as a tool or master having protrusions whose faces correspond to the {111} faces of silicon. The angle between those faces is 70° (or more precisely, 70.53°). The thickness of the silicon sh et is suitably around 300 microns. Other materials that can be anisotropically etched—suitably other semiconductive materials—could be used.

Microcutting tools may be fabricated by first producing sharp features in e.g. a silicon waver by anisotropic etching techniques. That microshaped wafer may be used as the tool itself, or subsequently replicas of that wafer may be made for use as the tool. If the wafer is shaped as a negative of the desired tool then the tool may be moulded on the wafer. If the wafer is a positive version of the desired tool then a first replica of the wafer may be made, and then the tool may be formed as a replica of that first replica. The replicas are suitably made in materials such as thermoplastic and thermosetting polymers. This has the advantage that sharp grooves can be etched into the original master, e.g. a silicon waver, what is often a more straight-forward process than etching sharp ridges. The polymeric replicas of such an original master should be sufficiently hard and capable of cutting through the layers to be structured. Accordingly, polymers used for replica production preferably have a glass transition temperature larger than 25° C., more preferably larger than 110° C. and most preferably larger than 150° C. The latter temperatures generally are well known and can be found for instance in Polymer Handbook (Eds., J. Brandrup, H. Immergut, E. A. Grulke, John Wiley & Sons., New York, 1999). Preferably, high-glass transition, thermosetting resins are used for producing replicated microcutting tools, such as cyanate ester resins (e.g. 4,4'ethylidenediphenyl dicyanate and oligo(e-methylen-1,5-phenylencyanate) or epoxy resins such as tetrafunctional tetraglycidyl diaminodiphenylmethane). The latter may be mixed before with an aromatic hardener such as 4,4'-diamino diphenyl sulfone, DDS. In order to fabricate replicas, a polymer melt, solution or pre-polymeric liquid as those listed above is cast, injection- or reaction moulded, and solidified in contact with the master structure by e.g. cooling, thermally or photochemically crosslinking. The original master surfaces may be rendered non-adhesive, e.g. by rendering it hydrophobic, using suitable surface treatments such as chemically modification with self-assembling monolayers (e.g. silylation from vapour phase using e.g. octadecyltrichlorosilane, perfluorodecyltrichlorosilane and allyltrimethoxysilane). Alternatively, release coatings or agents such as silicon oil may be employed on the surface of the original master. It may also be useful to apply such coatings to the cutting surface of the tool.

As stated above, such polymeric replicas of the original master structure again can be used to produce $2^{nd}$, $3^{rd}$ or higher generation replicas ("sub-masters") which have either the same relief structure as the original master or a negative of it. Crucial is that the final microcutting tool comprises sharp protruding edges, such as sharp ridges. In order to produce such "submasters" via e.g. embossing, injection- or reactive moulding, which subsequently can be used to replicate the final microcutting tool, preferably polymeric materials are employed that display good non-adhesive properties, such as perfluorinated polymers, polyolefins, polystyrene, or silicone rubbers (e.g. polydimethylsiloxane). Obviously, such submasters may be bended or rolled or shaped in whatever geometry is most desired depending on the device and device configuration to be fabricated in order to produce cylinder-shaped microcutting tools or microcutting tools of more complex geometries. For this purpose, it is useful to use flexible, polymeric materials, such as polydimethylsiloxane or polyolefins for submaster production.

Submasters according to one embodiment of the present invention were prepared by first producing a negative replica in polystyrene, PS (atactic polystyrene, $M_w \approx 105$ kg mol$^{-1}$, $T_g \approx 100°$ C.; Aldrich). For this purpose, PS granulates were embossed at 180° C. with a silicon master comprising sharp grooves (height h≈10 mm, periodicity Λ=500 mm, edge angle α=70°; MikroMasch, Narva mnt. 13,10151, Tallinn, Estonia), applying onto the latter a nominal pressure of 300 g mm$^{-2}$ for 5 min (cf. Stutzmann, N., Tervoort, T. A, Bastiaansen, C. W. M. Feldman, K & Smith, P. *Adv. Mater.* 12, 557 (2000)). Subsequently, $2^{nd}$ generation polydimethylsiloxane (Sylgard silicone elastomer 184; Dow Corning Corporation) replicas according to one embodiment of the present invention were fabricated by poring the pre-polymeric liquid onto these embossed PS films and curing it for 24 hours at room temperature in air atmosphere. The final microcutting tools were fabricated by producing a $3^{rd}$ generation thermoset replica by first melting the cyanate ester resin Primaset PT15 (Lonza) at 110° C. for 30 min, casting this melt onto the structured PDMS films, curing it for 4 hours at 170° C. and, subsequently for 24 hours at 200° C., and removing at the end the PDMS replicas from the cured, surface-structured thermoset.

It is also possible to use microcutting tools fabricated by anisotropic etching directly from thin crystalline wafers. If the wafer thickness is less than 50 μm such microcutting tools are flexible and can be mounted on a cylindrical roller suitable for reel-to-reel embossing.

In order to fabricate complex integrated circuits using microcutting the microcutting tool might be fabricated with an arbitrary pattern of wedges, that is able to define the critical device dimensions of an arbitrarily complex circuit. If such a complex master is defined by anisotropic etching of a crystalline wafer, sophisticated etching techniques such as corner compensation (cf. van Kampen, R. P. and Wolffenbuttel, R. F. J. Micromech. Microeng. 5, 91 (1995), Scheibe, C. and Obermeier, E. J. Micromech. Microeng. 5, 109 (1995), Enoksson, P. J. Micromech. Microeng. 7, 141 (1997)) need to be used in order to ensure that all protruding wedges of the tool that are supposed to cut a certain layer of the multilayer stack have the same height.

Alternatively, the microcutting tool may have a very simple wedge pattern, such as an array of parallel, linear wedges. In this case all critical device dimensions need to be layout on a regular grid. However, circuits of arbitrary complexity can still be defined by appropriately defining the coarse pattern of the layer to be cut, and by depositing appropriate interconnections between the regularly spaced devices. This process is particularly suited for a reel-to-reel process based on a combination of direct printing and microcutting (see FIG. 12) In a first step a regular array of source-drain electrodes with suitable interconnections are written by a technique such as inkjet printing. Then the channel gap between source-drain electrodes is defined by microcutting. An active matrix display is an example where such a regular array of TFTs is particularly useful.

Similar approaches can be applied to the fabrication of via-holes for multilayer interconnect schemes starting from a microcutting tool with a regular array of point like protrusions with subsequent filling of selected via holes to provide the desired circuit function.

Another example demonstrates a method by which features in different layers of the device can be cut selectively by defining wedges of different height on the same master. The etching process to define the wedges of the master can be performed in subsequent steps to define several patterns of wedges with different heights, for example by varying the width of the lithographic features of the etch mask. Such a master is useful to define critical device dimensions in several layers of the device in a single embossing step.

The tool preferably has a cutting face that is presented to the material to be cut, and from which the cutting protrusions protrude. The cutting face is preferably planar. In many situations it will be preferable that the cutting protrusions all have the same depth.

The processes and devices described herein are not limited to devices fabricated with solution-processed polymers. Some of the conducting electrodes of the TFT and/or the interconnects in a circuit or display device (see below) may be formed from inorganic conductors, that can, for example, be deposited by printing of a colloidal suspension or by electroplating onto a pre-patterned substrate. In devices in which not all layers are to be deposited from solution one or more PEDOT/PSS portions of the device may be replaced with an insoluble conductive material such as a vacuum-deposited conductor.

For the semiconducting layer any solution processible conjugated polymeric or oligomeric material that exhibits adequate field-effect mobilities exceeding $10^{-3}$ cm$^2$/Vs, preferably exceeding $10^{-2}$ cm$^2$/Vs, may be used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)).

The semiconducting material can also be an inorganic semicondcutor such as thin film silicon deposited by vacuum or plasma deposition techniques.

The electrodes may be coarse-patterned by techniques other than inkjet printing. Suitable techniques include soft lithographic printing (J. A. Rogers et al., Appl. Phys. Lett 75, 1010 (1999); S. Brittain et al., Physics World May 1998, p. 31), screen printing (Z. Bao, et al., Chem. Mat. 9, 12999 (1997)), and photolithographic patterning (see WO 99/10939) or plating. Ink-jet printing is considered to be particularly suitable for large area patterning with good registration, in particular for flexible plastic substrates.

The device(s) can be deposited onto another substrate material, such as Perspex or a flexible, plastic substrate such as polyethersulphone. Such a material is preferably in the form of a sheet, is preferably of a polymer material, and may be transparent and/or flexible.

Although preferably all layers and components of the device and circuit are deposited and patterned by solution processing and printing techniques, one or more components such as a semiconducting layer may also be deposited by vacuum deposition techniques and/or patterned by a photolithographic process.

Devices such as TFTs fabricated as described above may be part of a more complex circuit or device in which one or more such devices can be integrated with each other and or with other devices. Examples of applications include logic circuits and active matrix circuitry for a display or a memory device, or a user-defined gate array circuit.

The microcutting process may be used to pattern other components of such circuit as well. One possibility is patterning of the pixel electrodes of an active matrix display. In a high-resolution display the optical state of each pixel (liquid crystal, organic or polymer light emitting diode, for example) is controlled by the voltage applied to each of the pixel electrodes. In an active matrix display each pixel contains a voltage latch, such as a TFT, which holds the voltage on the pixel while the other pixels are addressed and written. If the TFTs and addressing lines are in a different layer of the device as the pixel electrodes, for example, located below the pixel electrode and connected with the pixel electrode through a via hole, microcutting of a continuous pixel electrode can result in very high aperture ratio display, in which the aperture ratio is limited only by the small width of the microcut grooves.

It may be advantageous to hold the microcutting tool at the same temperature as the multilayer structure during the forcing step, e.g. within 5 C. Alternatively, they may be at different temperatures: thus the temperature of the microcutting tool may be more than 5° C. different from the temperature of the multilayer structure during the forcing step.

The present invention is not limited to the foregoing examples. Aspects of the present invention include all novel and/or inventive aspects of the concepts described herein and all novel and/or inventive combinations of the features described herein.

The applicant draws attention to the fact that the present inventions may include any feature or combination of features disclosed herein either implicitly or explicitly or any generalisation thereof, without limitation to the scope of any definitions set out above. In view of the foregoing description it will be evident to a person skilled in the art that various modifications may be made within the scope of the inventions.

The invention claimed is:

1. A method for forming an electronic switching device in a multi-layer structure comprising at least a first layer and an underlying second layer, the method comprising:
   forcing a microcutting protrusion of a cutting tool into the multi-layer structure so as to cause the protrusion to microcut through the first layer and into the second layer; and
   wherein the microcut first layer forms at least one electrode of said electronic switching device,
   wherein the second layer is in the solid state while the forcing step is performed, and
   wherein the electronic switching device comprises a semiconducting material between source and drain electrodes, and wherein the microcutting serves to define an edge adjacent to the semiconducting material of at least one of said source and drain electrodes.

2. The method as claimed in claim 1, wherein the first and second layers have different electrical properties.

3. The method as claimed in claim 1, wherein the material of which at least one layer is formed is in its solid state while the forcing step is performed.

4. The method as claimed in claim 1, wherein the protrusion has at least one edge having a radius of curvature less than 100 nm.

5. The method as claimed in claim 1, wherein the protrusion has at least one edge having a radius of curvature less than 10 nm.

6. The method as claimed in claim 1, wherein the depth of the protrusion is less than 10 micrometers.

7. The method as claimed in claim 1, wherein the depth of the protrusion is less than 1 micrometers.

8. The method as claimed in claim 1, wherein the width of the protrusion in at least one direction parallel to the layers is less than 100 micrometers.

9. The method as claimed in claim 1, wherein the width of the protrusion in at least one direction parallel to the layers is less than 10 micrometers.

10. The method as claimed in claim 1, wherein the width of the protrusion in at least one direction parallel to the layers is less than 2 micrometers.

11. The method as claimed in claim 1, wherein the protrusion is formed of a material whose surface has been treated to reduce the coefficient of friction between the tool and multilayer structure.

12. The method as in claim 1 in which the microcutting tool or the multilayer structure or both are in contact with a soft material during the micro cutting step.

13. The method as claimed in claim 1, wherein the tool is a flexible sheet bearing the protrusion.

14. The method as claimed in claim 1, wherein the tool is rolled over the structure.

15. The method as claimed in claim 1, wherein the tool is rolled over the structure in substantially linear path.

16. The method as claimed in claim 1, wherein the cutting tool has a plurality of microcutting protrusions.

17. The method as claimed in claim 16, wherein the protrusions take the form of elongated ridges.

18. The method as claimed in claim 17, wherein the ridges are linear.

19. The method as claimed in claim 17, wherein the ridges are parallel.

20. The method as claimed in claim 16, wherein the protrusions are all of the same depth.

21. The method as claimed in claim 16, wherein the protrusions are of different depth.

22. The method as in claim 1, wherein the temperature of the microcutting tool is within 5° C. of the temperature of the multilayer structure during the forcing step.

23. The method as in claim 1, wherein the temperature of the micro cutting tool is more than 5° C. different from the temperature of the multilayer structure during the forcing step.

24. The method as claimed in claim 1, wherein the second layer is electrically non-conductive or semiconductive.

25. The method as claimed in claim 1, wherein the first and second layers form functionally different parts of the electrical device.

26. The method as claimed in claim 1 wherein the microcut first layer forms a plurality of electrodes of the electronic switching device.

27. The method as claimed in claim 1 wherein the microcut layer forms source and drain electrodes of a transistor device.

28. The method as claimed in claim 1, wherein the multilayer structure has additional layers on the other side of the second layer from the first layer, and the step of forcing comprises forcing the microcutting protrusion of the cutting tool into the multilayer structure so as to cause the protrusion to microcut through the first layer, and the second layer, and through or into at least one of the additional layers.

29. The method as claimed in claim 28, wherein at least one of the additional layers is electrically conductive or semiconductive.

30. The method as claimed in claim 29, wherein the microcutting tool cuts into or through the said additional semiconductive or conductive layer.

31. The method as in claim 28, wherein the first layer and said additional conductive or semiconductive layer form functionally different elements of the device.

32. The method as in claim 31, wherein said additional conductive or semiconductive layer form electrodes of an electronic switching device.

33. The method as in claim 32, wherein the first layer and said additional conductive or semiconductive layer form source and drain electrodes, respectively, of a transistor device.

34. The method as claimed in claim 1, wherein the step of forcing forms at least one recess in the structure, and the method comprises depositing at least one or more materials on top of the microcut multilayer structure.

35. The method as claimed in claim 34, wherein at least one of the said materials is deposited selectively into the recess or selectively adjacent to the recess or selectively adjacent and partly into the recess.

36. The method as claimed in claim 34, wherein at least one of the said materials deposited over the multilayer structure forms a conformal coating on the multilayer structure or selectively on the recess structure or selectively on at least part of the structure adjacent to the recess.

37. The method as claimed in claim 34, wherein at least one of the said materials is deposited by printing.

38. The method as claimed in claim 34, wherein at least one of said materials is a semiconductive material.

39. The method as claimed in claim 38, wherein said semiconductive material is a polymer.

40. The method as claimed in claim 38, wherein said semiconductive material forms an active semiconducting layer of the electronic switching device.

41. The method as claimed in claim 38, wherein said semiconductive material is arranged to emit light.

42. The method as claimed in claim 34, wherein at least one of the materials deposited into the recess is arranged to guide light.

43. The method as claimed in claim 34, wherein one of said materials deposited into the recess is electrically conductive.

44. The method as claimed in claim 43, wherein said conductive material forms the gate electrode of the electronic switching device.

45. The method as in claim 34, wherein at least one of the materials deposited onto the multilayer structure is patterned.

46. The method as in claim 34, wherein at least one of the materials deposited onto the multilayer structure is patterned by direct printing.

47. The method as claimed in claim 1, wherein the first layer is organic.

48. The method as claimed in claim 1, wherein the first layer is metallic.

49. The method as claimed in claim 1 wherein the second layer is organic.

50. The method as claimed in claim 1, wherein the electronic switching device is a transistor.

51. The method as claimed in claim 1, comprising a second step of forcing the microcutting protrusions of the same or a different cutting tool into the multilayer structure wherein during the second step of forcing the cutting tool is orientated differently from the orientation of the cutting tool during the first step of forcing.

52. The method as claimed in claim 51 wherein the first step of forcing forms a first series of elongate cuts in the structure, and the second step of forcing forms a second set of elongate cuts angled with respect to the first set of cuts.

53. The method as in claim 1, wherein at least one of the layers of the multilayer structure is patterned.

54. The method as claim 1, wherein at least one of the layers of the multilayer structure is patterned by direct printing.

55. The method as in claim 1 wherein the multilayer structure also includes a substrate and the microcutting protrusion microcuts through the first layer without microcutting completely through the substrate.

56. The method as in claim 1 wherein said forcing is carried out by embossing.

57. The method as claimed in claim 1, wherein the forcing of the microcutting protrusion is done without lateral movement of the protrusion with respect to the multilayer structure, and wherein the method further comprises withdrawing the microcutting protrusion so as to leave a recess having a size determined by the shape of the microcutting protrusion and the depth to which it is forced in to the multilayer structure; and wherein the second layer comprises a material different from the material of said first layer.

58. The method as claimed in claim 1, wherein the method further comprises withdrawing the microcutting protrusion so as to leave a recess having a size determined by the shape of the microcutting protrusion and the depth to which it is forced in to the multilayer structure such that all dimensions of the recess are determined by the shape of the microcutting protrusion and the depth to which it is forced onto the multilayer structure; and wherein the second layer comprises a material different from the material of said first layer.

* * * * *